(12) United States Patent
Zhang et al.

(10) Patent No.: US 11,863,181 B2
(45) Date of Patent: Jan. 2, 2024

(54) LEVEL-SHIFTER

(71) Applicant: NXP USA, Inc., Austin, TX (US)

(72) Inventors: Xu Zhang, Chandler, AZ (US);
Xiaoqun Liu, Chandler, AZ (US);
Siamak Delshadpour, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/448,515

(22) Filed: Sep. 22, 2021

(65) Prior Publication Data

US 2023/0090949 A1 Mar. 23, 2023

(51) Int. Cl.
*H03K 19/0185* (2006.01)
*H04L 25/02* (2006.01)

(52) U.S. Cl.
CPC . *H03K 19/018528* (2013.01); *H04L 25/0272* (2013.01)

(58) Field of Classification Search
None
See application file for complete search history.

(56) References Cited

U.S. PATENT DOCUMENTS

| | | | | |
|---|---|---|---|---|
| 5,610,547 A * | 3/1997 | Koyama | ............... | G06G 7/24 330/252 |
| 6,018,261 A * | 1/2000 | Alford | ............ | H03K 19/00369 327/540 |
| 6,433,611 B1 * | 8/2002 | Foroudi | ............... | H03K 19/013 327/170 |
| 6,618,406 B1 * | 9/2003 | Kaminishi | ............... | H01S 5/042 372/38.02 |
| 7,248,076 B2 * | 7/2007 | Chen | ............... | H03K 19/09429 326/83 |
| 7,301,370 B1 * | 11/2007 | Hanna | ............... | H03K 19/0948 327/333 |
| 7,642,828 B2 * | 1/2010 | Sakai | ............... | H03K 3/356165 327/333 |
| 8,222,954 B1 * | 7/2012 | Ren | ............... | H03K 19/00369 323/317 |
| 8,466,718 B2 * | 6/2013 | Ezumi | ............... | H03K 19/00361 327/108 |
| 9,608,611 B1 * | 3/2017 | Hearne | ............... | H03K 5/135 |
| 11,139,843 B1 * | 10/2021 | Li | ............... | H04B 1/04 |
| 11,256,285 B2 * | 2/2022 | Seo | ............... | H03K 5/135 |
| 2002/0190770 A1 * | 12/2002 | Yin | ............... | H03K 19/215 327/210 |

(Continued)

OTHER PUBLICATIONS

Emami-Neyestanak, Azita et al; "A 6.0-mW 10.0-Gb/s Receiver With Switched-Capacitor Summation DFE", IEEE Journal of Solid-State Circuits, vol. 42, No. 4, pp. 889-896; ( 2007).

(Continued)

*Primary Examiner* — Thomas J. Hiltunen
*Assistant Examiner* — Khareem E Almo

(57) ABSTRACT

One example discloses a level-shifter circuit, comprising: a pre-driver stage configured to receive differential inputs and generate differential pre-driver outputs; a first output stage coupled to receive the differential pre-driver outputs and generate a single-ended first stage output; a second output stage coupled to receive the differential pre-driver outputs and generate a single-ended second stage output; and wherein the first and second stage outputs together form a differential output.

18 Claims, 5 Drawing Sheets

(56) References Cited

U.S. PATENT DOCUMENTS

| | | | |
|---|---|---|---|
| 2003/0067337 A1* | 4/2003 | Yin | H03K 3/3562 327/210 |
| 2004/0227558 A1* | 11/2004 | Hayashi | H03K 19/00323 327/333 |
| 2005/0258875 A1* | 11/2005 | Wang | H03K 19/018528 327/108 |
| 2006/0186921 A1* | 8/2006 | Chen | H03K 19/0016 326/58 |
| 2007/0001716 A1* | 1/2007 | Sanchez | H03K 19/018585 327/112 |
| 2009/0153219 A1* | 6/2009 | Wu | H03F 3/45179 327/333 |
| 2010/0308888 A1* | 12/2010 | Kubo | H03K 19/018528 327/333 |
| 2012/0057262 A1* | 3/2012 | Yeh | G08C 19/00 361/58 |
| 2014/0132592 A1* | 5/2014 | Liu | H04B 1/04 375/295 |
| 2015/0269112 A1* | 9/2015 | Hsueh | G06F 13/4072 710/105 |
| 2017/0302267 A1* | 10/2017 | Luo | H03F 3/45183 |
| 2020/0321944 A1* | 10/2020 | Nomura | H04L 25/029 |

OTHER PUBLICATIONS

Lin, Zhihong; Texas Instruments; "Understanding the embedded USB2 (eUSB2) standard"; retrieved from the internet https://e2e.ti.com/blogs_/b/analogwire/posts/understanding-emb.

Noguchi, Ryosuke et al; "A 25-Gb/s Low-Power Clock and Data Recovery with an Active-Stabilizing CML-CMOS Conversion";IEEE International Conference on Electronics, Circuits and Systems (ICECS); 4 pages 2018.

NXP; "Audio Softare on NXP Microcontrollers"; retrieved from the Internet https://www.nxp.com/search?keyword=TUSB2E22&start=0 ; 5 pages (Sep. 15, 2021).

Tondo, Diego Fabian et al.; "A Low-Power, High-Speed CMOS/CML 16:1 Serializer", 2009 Argentine School of Micro-Nanoelectronics, Technology and Applications; 6 pages (2009).

* cited by examiner

LEVEL-SHIFTER

The present specification relates to systems, methods, apparatuses, devices, articles of manufacture and instructions for level-shifting.

SUMMARY

According to an example embodiment, a level-shifter circuit, comprising: a pre-driver stage configured to receive differential inputs and generate differential pre-driver outputs; a first output stage coupled to receive the differential pre-driver outputs and generate a single-ended first stage output; a second output stage coupled to receive the differential pre-driver outputs and generate a single-ended second stage output; and wherein the first and second stage outputs together form a differential output.

In another example embodiment, the pre-driver stage includes two resistor loads coupled to a diode connected MOS device configured to set a minimum voltage for the single-ended first and second stage outputs.

In another example embodiment, the pre-driver stage includes two resistor loads coupled to a diode connected MOS device configured to set a common mode voltage for the first and second output stages.

In another example embodiment, the pre-driver stage includes two resistor loads coupled to a diode connected MOS device; the two resistor loads have equivalent resistances; the first and second output stages each include a resistor load; and the resistor load of the two resistor loads in the pre-driver stage is an integer multiple of the resistor load for the output stages.

In another example embodiment, the pre-driver stage includes two resistor loads coupled to a diode connected MOS device; the first and second output stages each include a set of MOS devices; and a width of the MOS device in the pre-driver stage is an integer multiple of a width of each of the MOS devices in the output stages.

In another example embodiment, the pre-driver stage includes two resistor loads (R1, R2) coupled to a diode connected MOS device (M0); the two resistor loads have equivalent resistances (R1=R2); the first and second output stages each include a resistor load (R3, R4) and a set of MOS devices (M1, M2, M3, M4); and R1=R2=2*R3=2*R4; and widths of M1, M2, M3, and M4 are each equal to 0.5*M0.

In another example embodiment, the first and second output stages are configured to consume substantially a same amount of current as the pre-driver stage.

In another example embodiment, the differential inputs and differential outputs are either eUSB or USB signals.

In another example embodiment, the differential inputs and differential outputs are either CIVIL (current mode logic) or CMOS signals.

In another example embodiment, the level-shifter is embedded in a signal repeater.

In another example embodiment, the level-shifter is embedded in a logic converter.

In another example embodiment, further comprising a set of inverters configured to buffer the differential output.

In another example embodiment, the pre-converter, the first stage, and/or the second stage includes an enable/disable circuit configured to control power received from a power supply.

In another example embodiment, the first stage, and/or the second stage includes a pull-up circuit configured to pull either the single-ended first and/or second stage outputs up to a predetermined signal level.

In another example embodiment, the first stage, and/or the second stage includes a pull-down circuit configured to pull either the single-ended first and/or second stage outputs down to a predetermined signal level.

In another example embodiment, further comprising a controller configured to place the level-shifter into an off-mode, an idle-mode, or an active-mode.

In another example embodiment, in the idle-mode the pre-driver stage is turned on and the first and second output stages are turned off.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
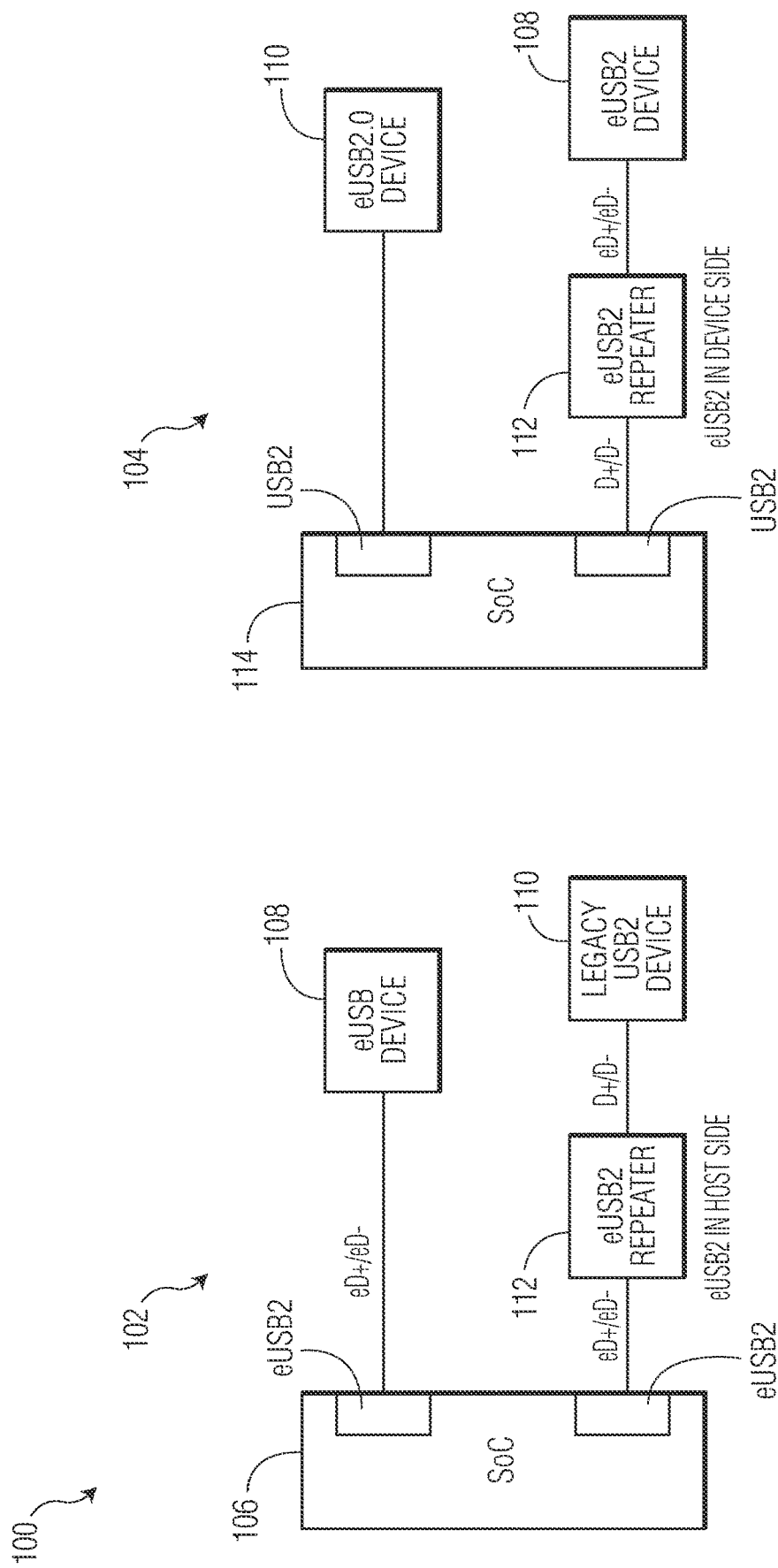
FIGS. 1A and 1B represents examples of two eUSB to USB configurations requiring level-shifting.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Level-shifting, logic-conversion, signal-interfacing, etc. all refer to ensuring electrical compatibility between one or more electrical circuits, modules, or systems. In the discussion herein, the phrase level-shifting will be substantially used; however, the concepts and examples discussed applied to a wide variety of such electrical interfacing. Just one example application employing such level-shifters is now presented for Universal Serial Bus (USB) interfaces.

USB (e.g. v2.0) has been one of the most successful wired interfaces in the past 20 years, and almost all SoCs today are equipped with a USB 2.0 interface. USB standards evolution kept the original 3.3-V I/O USB 1.0 interface intact for backward compatibility, helping enable wider adoption and a larger ecosystem while also preserving device interoperability. However, as process nodes approach more advanced node (e.g. 5 nm), the manufacturing cost to maintain USB 2.0 3.3V I/O signaling has grown exponentially.

Embedded USB2 (eUSB2) is a supplement specification to the USB 2.0 specification that addresses issues related to interface controller integration with advanced system-on-chip (SoC) process nodes by enabling USB 2.0 interfaces to operate at I/O voltages of 1V or 1.2V instead of 3.3V. eUSB2 can enable smaller, more power-efficient SoCs, in turn enabling process nodes to continue to scale while increasing performance in applications such as smartphones, tablets and notebooks. In some examples, designers integrate the eUSB2 interface at a device level while leveraging and reusing the USB 2.0 interface at a system level. eUSB2 can support onboard inter-device connectivity through direct connections as well as exposed connector interfaces through an eUSB2-to-USB 2.0 repeater for performing level shifting.

The following Table presents some differences between USB 2.0 and eUSB2:

| | Feature | |
|---|---|---|
| | USB 2.0 | eUSB2 |
| Signal interface | D+, D− | eD+, eD− |
| I/O voltage | 3.3 V (Lowspeed/full-speed), <1 V (Highspeed) | 1 V or 1.2 V |
| Supported data rate | Low speed: 1.5 Mbps<br>Full speed: 12 Mbps<br>High speed: 480 Mbps | Low speed: 1.5 Mbps<br>Full speed: 12 Mbps<br>High speed: 480 Mbps |

FIGS. 1A and 1B represents examples 100 of two eUSB to USB configurations 102, 104 requiring level-shifting.

The first configuration 102 includes a system on a chip (SoC) having two eUSB embedded interfaces (as shown). The chip 106 is configured to be coupled to an external eUSB device 108 and to a legacy USB2 device 110. An eUSB2 repeater 112 is necessary to convert a differential eUSB signal (eD+/eD−) to a differential USB signal (D+/D−). The eUSB2 repeater 112 in some examples is on a same PC board as the chip 106, while the eUSB 108 and USB 110 devices are coupled via cabling.

The second configuration 104 is substantially similar to the first configuration 102, except now an SoC 114 includes two USB2 embedded interfaces (as shown).

In some example applications, eUSB2 repeater 112 is need to perform CIVIL (current mode logic) to CMOS logic conversions. In such applications, low jitter is a key requirement for level-shifters in the eUSB2 repeater 112. Many CIVIL-to-CMOS converter level-shifters suffer from either elevated jitter problems or power/current penalties across different process, voltage and temperature (PVT) corners.

For example, some CIVIL-to-CMOS converter level-shifters suffer severe power penalties since their output stages have wide variation over PVT. Non-differential applications can have even worse jitter performance as the essentially rely on a single inverter stage for the level-shifting/conversion. Other example CML-to-CMOS converter level-shifters include diode connected MOS devices as loads in a pre-driver stage, which also degrades the jitter performance.

Figure 2:
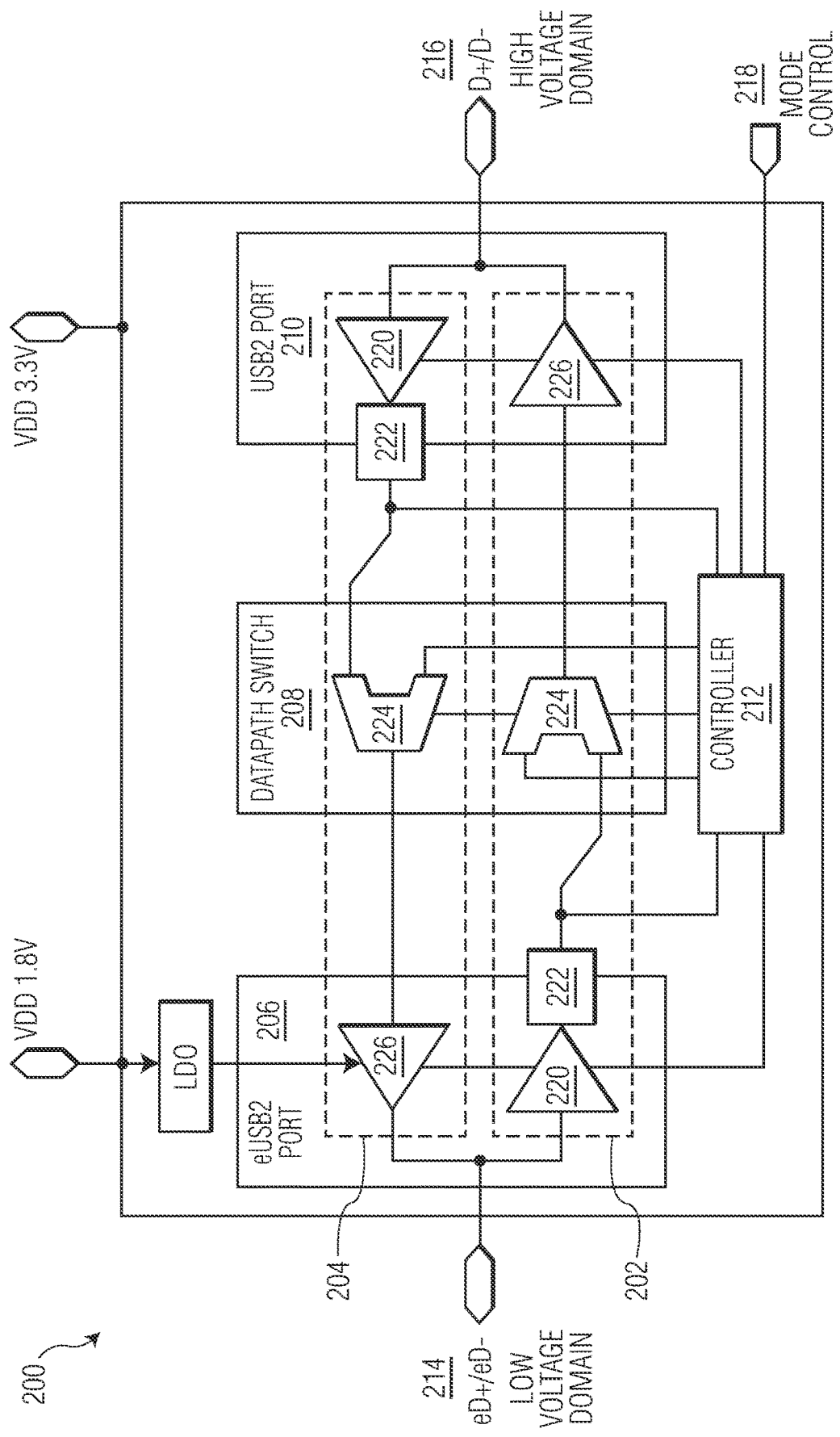
FIG. 2 represents an example bi-directional eUSB repeater.

FIG. 2 represents an example bi-directional eUSB repeater 200. This example repeater follows the first configuration 102 example in FIG. 1A, but in another example embodiment could follow the second configuration 104 in FIG. 1B.

The repeater 200 includes a transmit datapath 202, a receive datapath 204, an eUSB2 port 206, a datapath switch matrix 208, a USB2 port 210, and a controller 212. The repeater 200 is configured to be coupled to differential eUSB signals (eD+/eD−) 214 in a low voltage domain, and differential USB signals (D+/D−) 216 in a high voltage domain. Power supplies VDD 1.8V, VDD 3.3 V and a mode control 218 signal is also shown.

The transmit and receive datapaths 202, 204 are substantially similar and include: a slicer 220, a level-shifter 222, a datapath switch 224, and a line-driver 226. The datapaths 202, 204 in various embodiments also include (not shown) a continuous time linear equalizer (CTLE), a feed forward equalizer (FFE) for removing most intersymbol interference (ISI), input and termination resistors (RT). RT can be different for different standards (e.g. for an USB2 to an eUSB repeater, input RT=40Ω, output RT=45Ω).

The slicer 220 makes a (non-linear) hard decision and makes the data signal either high or low, which avoids propagation of amplitude noise and allows regeneration of pre-emphasis, but turns residual intersymbol interference (ISI) into timing jitter. Since the data signal after the slicer 220 is in either the lower voltage domain (e.g. 1.8V) or the high voltage domain (e.g. 3V), depending upon the datapath 202, 204, the level-shifter 222 either steps-up or steps-down the signal voltage as required before the line driver 226.

Figure 3:
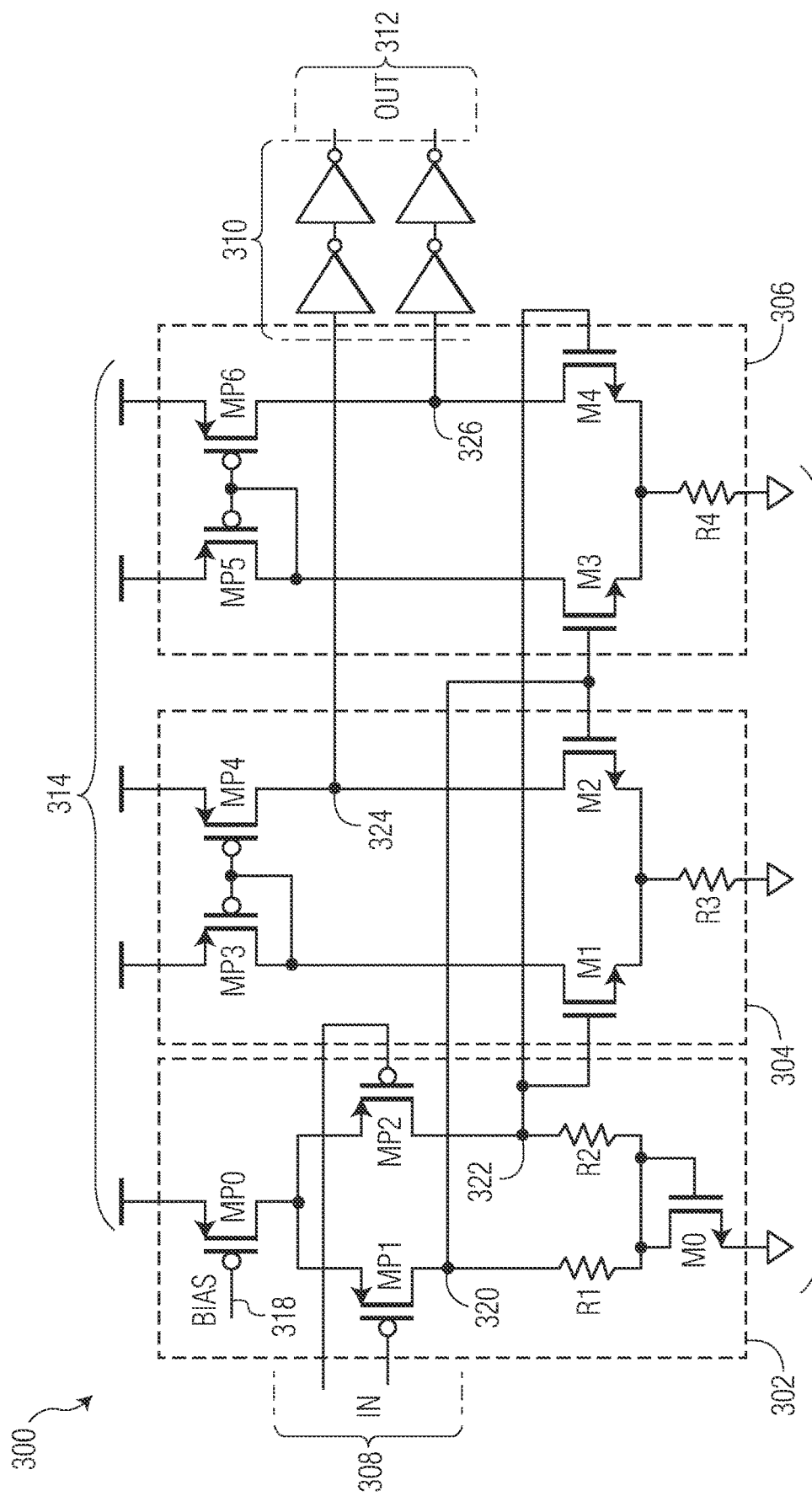
FIG. 3 represents a first example level-shifter.

FIG. 3 represents a first example level-shifter 300. The level-shifter 300 in some example embodiments can be used as the level-shifter 222 in either datapath 202, 204 in FIG. 2.

The level-shifter 300 includes: a pre-driver stage 302, a first output stage 304, a second output stage 306, differential input 308, output buffer 310, differential output 312, supply voltages (VDD) 314, and ground potentials 316.

The pre-driver stage 302 includes MP0, MP1, MP2, M0, R1 and R2. The pre-driver stage 302 receives the differential input 308 and a bias signal 318 and generates differential pre-driver outputs 320, 322. The pre-driver stage 302 has two resistor loads and a diode connected MOS device (M0) configured to set a minimum single-ended output voltage of the pre-driver stage 302 and a common mode voltage for the output stages 304, 306.

The first output stage 304 includes M1, M2, R3, MP3, and MP4. The first output stage 304 receives the differential pre-driver outputs 320, 322 and generates a single-ended first stage output 324.

The second output stage 306 includes M3, M4, R4, MP5, and MP6. The second output stage 306 also receives the differential pre-driver outputs 320, 322 but then generates a single-ended second stage output 326.

The output buffer 310 receives the first stage output 324 and the second stage output 326 and generates the differential output 312. The output buffer 310 inverters are sized for driving additional circuits coupled to the differential output 312. The output buffer 310 can be removed if such additional circuits would not heavily load the level-shifter 300.

Various example embodiments of the level shifter 300 can be tuned to handle many PVT (Process, Voltage, Temperature) dependent current variations, as well as tuned for specific power consumption and overall jitter performance. In some example embodiments to minimize current spread over PVT, resistors are set a R1=R2=2*R3=2*R4 and MOS device widths are set as 0.5*M0=M1=M2=M3=M4. Using such ratio settings, both output stages 304, 306 each individually consume about a same amount of current as the pre-driver stage 302 does, and current consumption of the output stages 304, 306 will not vary significantly over PVT, as the current consumption of stage 302 is a scaled version of a bias current.

Current consumption can be controlled by adjusting ratios between the MOS devices and resistors in the pre-driver stage 302 the first output stage 304 and the second output stage 306. Current consumption of the pre-driver stage 302, is typically a multiple integer times of a bias current that, together with a bias generation circuit, sets the bias signal 318 of the MP0 transistor. In various example embodiments, different resistance and width ratios can be set so that the output stages 304, 306 consume more or less current than the pre-driver stage 302.

MP0, MP1, MP2, R1, and R2 in the pre-driver stage 302 in various example embodiments work as a normal current-mode logic (CML) circuit, which preserves the low jitter feature. The pre-driver stage 302 avoids diode connected MOS device to achieve good jitter performance. In some example embodiments, the level-shifter 300 tuning can achieve a few pico-seconds jitter in a USB2/eUSB communication system having a 480 Mbps data rate.

The controller 212 (see FIG. 2) in some example embodiments is configured to place the level-shifter 300 into either an off-mode, an idle-mode, or an active-mode.

Figure 4:
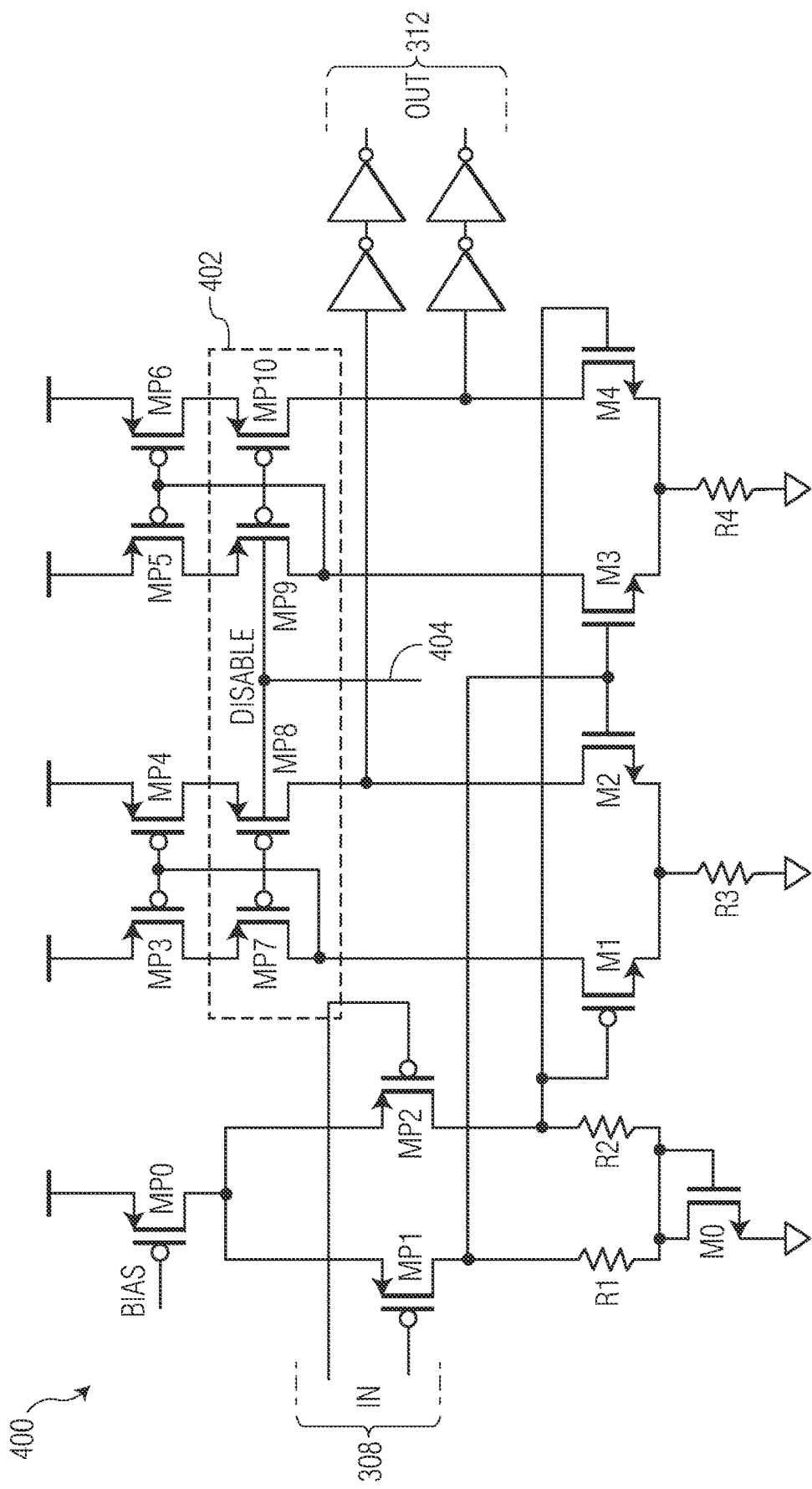
FIG. 4 represents a second example level-shifter.
Figure 5:
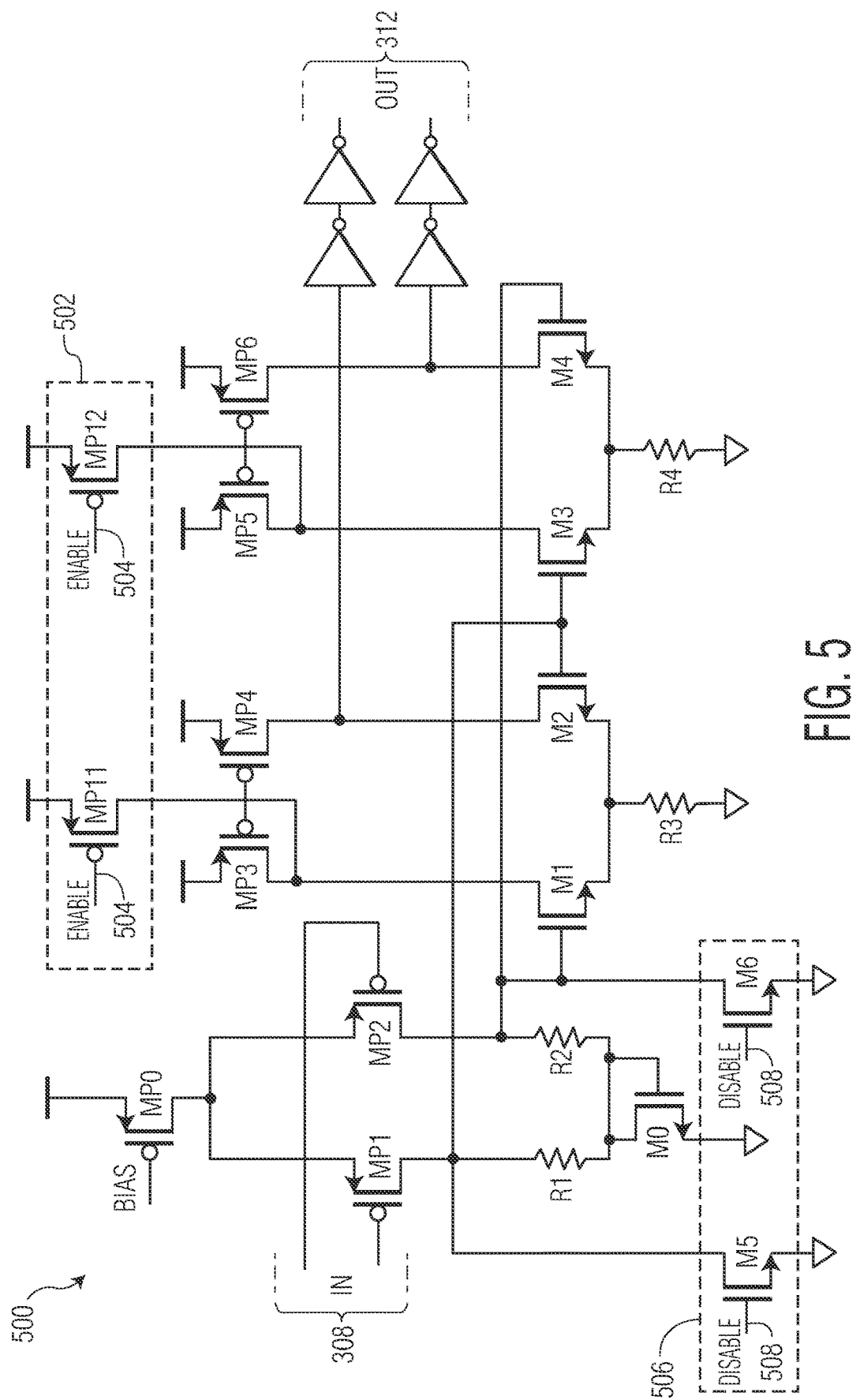
FIG. 5 represents a third example level-shifter.

In the off-mode, the bias signal 318 at MP0 is pulled high to completely turn off the pre-driver stage 302 and the output stages 304, 306 are turned off using disable/enable signals (such as shown in FIGS. 4 and 5).

In the idle-mode, the pre-driver stage 302 is turned on by setting the bias voltage at 318 at MP0 to provide a bias current. In the idle-mode the output stages 304, 306 are still turned off In the idle-mode, the level-shifter 300 is partially on so as to be ready for a fast transition from the idle-mode to the active-mode.

In the active-mode, the pre-driver stage 302 is turned on and the output stages 304, 306 are turned on using the disable/enable signals.

While the level-shifter 300 is shown as implemented with particular PMOS and NMOS transistors, in other example embodiments, implementations can be easily revised NMOS and PMOS transistors.

FIG. 4 represents a second example level-shifter 400. The second example level-shifter 400 is substantially similar to the example level-shifter 300 except that the second example level-shifter 400 further includes an enable/disable circuit 402. The enable/disable circuit 402 includes MP7, MP8, MP9 and MP10 and is controlled by an enable/disable signal 404.

In some example embodiments, when the level-shifter 300 is placed in the active mode, hot carrier degradation can be a problem for MP4 and MP6 as these MOS devices would then see none-zero current when their source-gate voltage is close to half the supply voltage (VDD) 314 and their source-drain voltage is close to the supply voltage (VDD) 314.

In some example embodiments, since M1, M2, M3 and M4 may see significantly different current in an idle mode due to mismatches, switch devices MP7, MP8, MP9, and MP10 are added to cut off current from the supply voltage (VDD) 314. MP7, MP8, MP9, and MP10 also significantly reduce the source-drain voltages for MP4 and MP6 in the active-mode. Hot carrier degradation, as a result, can be substantially improved.

FIG. 5 represents a third example level-shifter 500. The third example level-shifter 500 is substantially similar to the example level-shifter 300 except that the third example level-shifter 500 further includes a first enable/disable circuit 502 responsive to pull-up signals 504 and a second enable/disable circuit 506 responsive to pull-down signals 508.

The third example level-shifter 500 is most applicable when there is not significant hot carrier degradation of the transistors in the output stages 304, 306. If MP4 and MP6 do not have significant hot carrier degradation then the pull-up signals 504 and pull-down signals 508 can be used to cut off current paths to M0-M4 to avoid asymmetric stress and minimize current consumption in the idle mode.

Note that the level-shifters 300, 400, 500 in various example embodiments can be substituted for the FIG. 2 level-shifter 222 in either datapath 202, 204.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A level-shifter circuit, comprising:
   a pre-driver stage configured to receive differential signal inputs and generate differential pre-driver signal outputs corresponding to the differential signal inputs, wherein the pre-driver stage includes,
     a first resistor load (R1) and a second resistor load (R2);
     wherein a first end of the first resistor load (R1) is directly connected to a diode connected MOS device that is directly connected to a ground,
     wherein a first end of the second resistor load (R2) is directly connected to both the first resistor load (R1) and the diode connected MOS device;
     a first transistor (MP1) having a first end coupled to a second end of the first resistor load (R1) and coupled to receive a first one of the differential signal inputs;
     a second transistor (MP2) having a first end coupled to a second end of the second resistor load (R2) and coupled to receive a second one of the differential signal inputs; and
     wherein a second end of the first transistor (MP1) is coupled to both a second end of the second transistor (MP2) and a PMOS transistor that is coupled to a supply voltage;
   a first output stage configured to directly receive both of the differential pre-driver outputs and generate a single-ended first stage output;
   a second output stage configured to directly receive both of the differential pre-driver outputs and generate a single-ended second stage output; and
   wherein the first and second stage outputs together form a differential signal output.

2. The circuit of claim 1:
   wherein the pre-driver stage includes the two resistor loads coupled to the diode connected MOS device configured to set a minimum voltage for the single-ended first and second stage outputs.

3. The circuit of claim 1:
   wherein the pre-driver stage includes the two resistor loads coupled to the diode connected MOS device configured to set a common mode voltage for the first and second output stages.

4. The circuit of claim 1:
   wherein the two resistor loads have equivalent resistances;
   wherein the first and second output stages each include a resistor load; and
   wherein the resistor load of the two resistor loads in the pre-driver stage is an integer multiple of the resistor load for the output stages.

5. The circuit of claim 1:
   wherein the first and second output stages each include a set of MOS devices; and wherein a width of the MOS device in the pre-driver stage is an integer multiple of a width of each of the MOS devices in the output stages.

6. The circuit of claim 1:
   wherein the pre-driver stage includes the two resistor loads (R1, R2) coupled to the diode connected MOS device (M0);
   wherein the two resistor loads have equivalent resistances (R1=R2);
   wherein the first and second output stages each include a resistor load (R3, R4) and a set of MOS devices (M1, M2, M3, M4); and
   wherein R1=R2=2*R3=2*R4; and
   wherein widths of M1, M2, M3, and M4 are each equal to 0.5*M0.

7. The circuit of claim 1:
   wherein the first and second output stages are configured to consume substantially a same amount of current as the pre-driver stage.

8. The circuit of claim 1:
   wherein the differential inputs and differential outputs are either eUSB or USB signals.

9. The circuit of claim 1:
   wherein the differential inputs and differential outputs are either CIVIL (current mode logic) or CMOS signals.

10. The circuit of claim 1:
    wherein the level-shifter is embedded in a signal repeater.

11. The circuit of claim 1:
    wherein the level-shifter is embedded in a logic converter.

12. The circuit of claim 1:
    further comprising a set of inverters configured to buffer the differential output.

13. The circuit of claim 1:
    wherein the pre-converter, the first stage, and/or the second stage includes an enable/disable circuit configured to control power received from a power supply.

14. The circuit of claim 1:
    wherein the first stage, and/or the second stage includes a pull-up circuit configured to pull either the single-ended first and/or second stage outputs up to a predetermined signal level.

15. The circuit of claim 1:
    wherein the first stage, and/or the second stage includes a pull-down circuit configured to pull either the single-ended first and/or second stage outputs down to a predetermined signal level.

16. The circuit of claim 1:
    further comprising a controller configured to place the level-shifter into an off-mode, an idle-mode, or an active-mode.

17. The circuit of claim 16:
    wherein in the idle-mode the pre-driver stage is turned on and the first and second output stages are turned off.

18. A level-shifter circuit, comprising:
    a pre-driver stage configured to receive differential signal inputs and generate differential pre-driver signal outputs corresponding to the differential signal inputs, wherein the pre-driver stage includes two resistor loads coupled to a diode connected MOS device that is connected to a ground reference voltage, two transistors coupled to the two resistor loads and configured to receive the differential signal inputs, and a PMOS transistor coupled to the two resistor loads via the two transistors and connected to a supply voltage;
    a first output stage configured to directly receive both of the differential pre-driver outputs and generate a single-ended first stage output;
    a second output stage configured to directly receive both of the differential pre-driver outputs and generate a single-ended second stage output; and wherein the first and second stage outputs together form a differential signal output;

further comprising a controller configured to place the level-shifter into an off-mode, an idle-mode, or an active-mode.

* * * * *